United States Patent [19]
Herd et al.

[11] Patent Number: 5,430,423
[45] Date of Patent: Jul. 4, 1995

[54] SUPERCONDUCTING MAGNET HAVING A RETRACTABLE CRYOCOOLER SLEEVE ASSEMBLY

[75] Inventors: Kenneth G. Herd, Niskayuna; Evangelos T. Laskaris, Schenectady; Paul S. Thompson, Stephentown, all of N.Y.

[73] Assignee: General Electric Company, Schenectady, N.Y.

[21] Appl. No.: 201,968

[22] Filed: Feb. 25, 1994

[51] Int. Cl.⁶ ............................ F17C 7/02; H01F 1/00
[52] U.S. Cl. ............................................ 335/216; 62/52.1
[58] Field of Search ................ 335/216; 62/52.1, 52.2, 62/52.3; 324/318, 319, 320, 248

[56] References Cited

U.S. PATENT DOCUMENTS

| | | | |
|---|---|---|---|
| 4,765,153 | 8/1988 | Wachi | 62/514 R |
| 4,876,413 | 10/1989 | Vermilyea | 174/15.4 |
| 4,878,352 | 11/1989 | Weber | 62/51.1 |
| 4,924,198 | 5/1990 | Laskaris . | |
| 4,926,647 | 5/1990 | Dorri | 62/51.1 |
| 4,930,318 | 6/1990 | Brzozowski | 62/51.1 |
| 4,986,077 | 1/1991 | Saho | 62/51.1 |
| 4,986,078 | 1/1991 | Laskaris | 62/51.1 |
| 5,023,584 | 6/1991 | Laskaris | 335/216 |
| 5,111,665 | 5/1992 | Ackermann . | |
| 5,129,232 | 7/1992 | Minas et al. . | |
| 5,153,546 | 10/1992 | Laskaris | 335/216 |
| 5,216,889 | 6/1993 | Herd et al. . | |
| 5,222,366 | 6/1993 | Herd et al. . | |
| 5,235,818 | 8/1993 | Horikawa | 62/51.1 |
| 5,257,915 | 11/1993 | Laskaris | 417/418 |
| 5,291,740 | 3/1994 | Schnurer | 62/51.1 |
| 5,301,507 | 4/1994 | Laskaris | 62/51.1 |

*Primary Examiner*—Leo P. Picard
*Assistant Examiner*—Stephen T. Ryan
*Attorney, Agent, or Firm*—Douglas E. Erickson; Paul R. Webb, II

[57] ABSTRACT

A superconducting magnet includes a cryocooler coldhead, a sleeve assembly, and a superconducting coil assembly. The sleeve assembly includes a flexible bellows and a sleeve tube and is attached to the superconducting coil assembly so that it may be retracted about one-eighth of an inch breaking thermal contact of the sleeve assembly with the coil assembly's magnet cartridge and thermal shield while remaining hermetically connected to the coil assembly's vacuum enclosure. The coldhead's housing is attached to the sleeve assembly so that the coldhead's first and second stage make unconnected thermal contact with the sleeve assembly. By first retracting the sleeve assembly, the coldhead may be removed therefrom without room temperature air forming an ice ball on the surfaces of the sleeve assembly and without a heat load being transferred to quench the superconducting coil assembly. This permits continuous magnet operation using dual coldheads and dual sleeve assemblies.

10 Claims, 3 Drawing Sheets

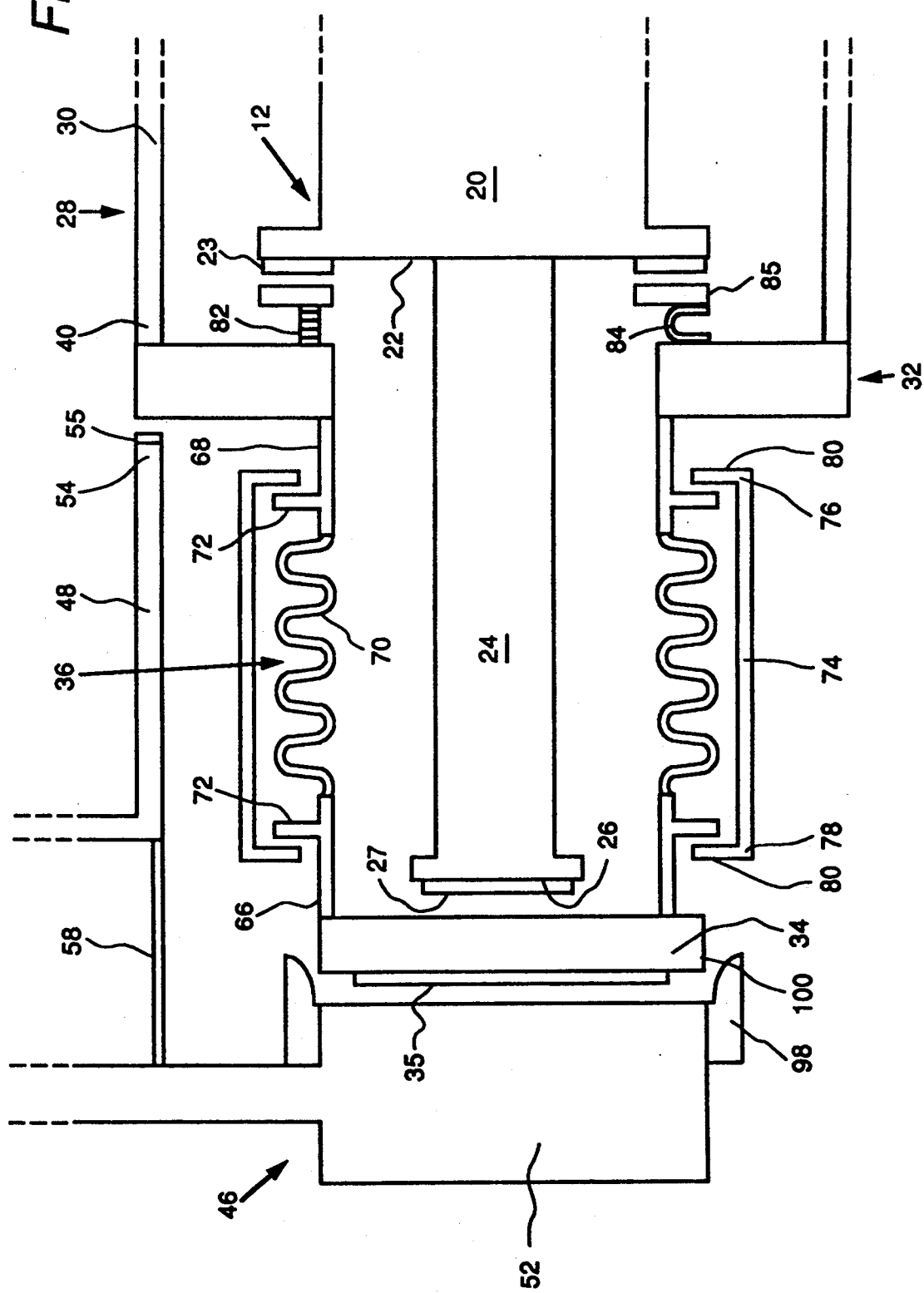

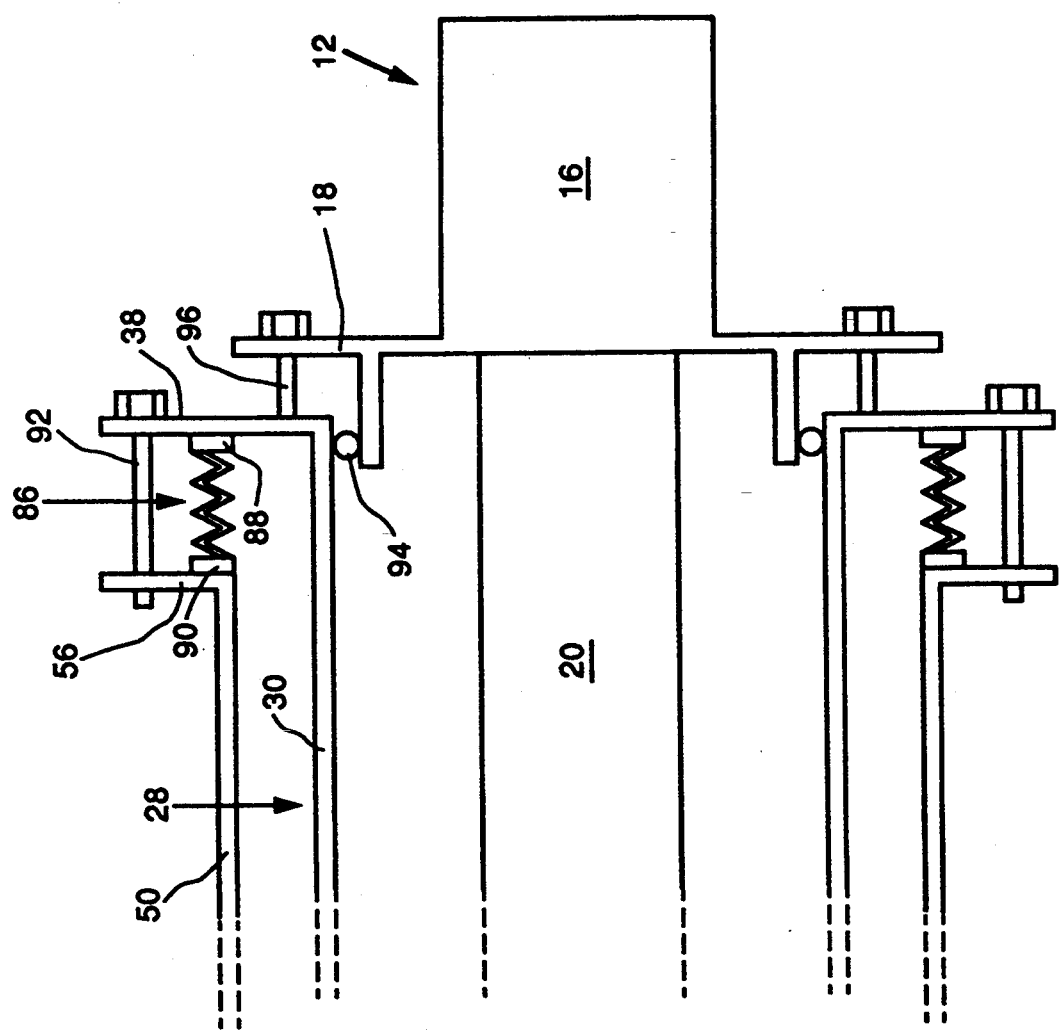

5,430,423

SUPERCONDUCTING MAGNET HAVING A RETRACTABLE CRYOCOOLER SLEEVE ASSEMBLY

BACKGROUND OF THE INVENTION

The present invention relates generally to a cryocooler-cooled superconductive magnet, and more particularly to such a magnet having a cryocooler coldhead which can be easily removed and replaced.

Superconducting magnets may be used for various purposes, such as to generate a uniform magnetic field as part of a magnetic resonance imaging (MRI) diagnostic system. MRI systems employing superconductive magnets are used in various fields such as medical diagnostics. Known designs include cryocooler-cooled superconductive magnets wherein the cryocooler coldhead is supported by the superconducting coil assembly through a cryocooler penetration assembly. Typically the cryocooler coldhead is mounted in a cryocooler sleeve assembly with a vacuum space independent from the cryostat vacuum, which allows for cryocooler coldhead removal and replacement. However, before removing the cryocooler coldhead, the superconducting magnet has to be slowly warmed up in a process that may take weeks. Removal of the cryocooler coldhead without slowly warming up the superconducting magnet would lead to warm room-temperature air entering the sleeve assembly from which the cryocooler coldhead was removed. Such warm room-temperature air would contact the cold surfaces within the sleeve assembly forming an ice ball of frozen water and air on such surfaces including those which had been in thermal contact with the removed cryocooler coldhead. These contaminated surfaces would require time-consuming cleaning before a replacement cryocooler coldhead could be installed. Additionally, removal of the cryocooler coldhead without slowly warming up the superconducting magnet would lead to the room-temperature air transferring a heat load to the magnet quenching its superconductivity.

Another known superconductive magnet design permitted the substitution of a second cryocooler coldhead for a first cryocooler coldhead during superconducting magnet operation. However, neither of the two cryocooler coldheads could be removed and replaced without a lengthy warm-up period for the superconductive magnet without contaminating the cryocooler penetration assembly and quenching the magnet.

A further known superconductive magnet design had a sleeve assembly between the cryocooler coldhead and the superconducting coil assembly. The design described the first stage of the cryocooler coldhead as being rigidly attached to the sleeve (such as by brazing) which would require breaking such rigid attachment to replace the cryocooler coldhead.

What is needed is an MRI magnet design which permits a cryocooler coldhead to be replaced without a long magnet warm-up period and without having to break and later having to re-establish a brazed (or the like) rigid attachment of the cryocooler coldhead to a sleeve (or other cryocooler penetration) assembly.

SUMMARY OF THE INVENTION

It is an object of the invention to provide a cryocooler-cooled superconducting magnet having an easily removable and replaceable cryocooler coldhead.

The superconducting magnet of the invention includes a first cryocooler coldhead having a generally longitudinal axis, a first sleeve assembly generally coaxially aligned with the first cryocooler coldhead, and a superconducting coil assembly. The first cryocooler coldhead includes a room temperature housing, a first stage attached to the room temperature housing, and a second stage attached to the first stage. The first sleeve assembly includes a sleeve tube generally radially spaced apart from and generally circumferentially surrounding the first stage, wherein a flange of the room temperature housing is hermetically and longitudinally adjustably connected to one of the ends of the sleeve tube. The first sleeve assembly also includes a mid portion, hermetically connected to the other of the ends of the sleeve tube and positioned longitudinally proximate and unconnected to an end of the first stage, and further includes an end portion positioned longitudinally proximate and unconnected to an end of the second stage. The first sleeve assembly additionally includes a first flexible bellows generally radially spaced apart from and generally circumferentially surrounding the second stage and hermetically connected to the end portion and to the mid portion. The superconducting coil assembly includes a magnet cartridge, a thermal busbar, a thermal shield, and a vacuum enclosure. The thermal busbar is attached to the magnet cartridge and has an end positioned longitudinally proximate the end portion of the first sleeve assembly. The thermal shield generally surrounds the magnet cartridge and has an end positioned longitudinally proximate the mid portion of the first sleeve assembly. The vacuum enclosure generally surrounds the thermal shield and has an end, wherein the one end of the sleeve tube is hermetically and longitudinally adjustably connected to the end of the vacuum enclosure.

Several benefits and advantages are derived from the invention. Having the one end of the sleeve tube hermetically and longitudinally adjustably connected to the end of the vacuum enclosure enables the sleeve tube to be retracted slightly, breaking thermal contact of the sleeve assembly's end portion with the thermal busbar and breaking thermal contact of the sleeve assembly's mid portion with the thermal shield. Thus, when the room-temperature housing of the cryocooler coldhead thereafter is longitudinally disconnected from the one end of the sleeve tube, the room-temperature air filling the cavity is thermally isolated from the cold thermal busbar and cold thermal shield. Therefore, no ice ball forms on the sleeve surfaces and no heat load is transferred to quench the magnet. Also, having the first and second stages of the cryocooler not connected to the sleeve assembly enables easy removal of the cryocooler coldhead by disconnecting its room temperature housing from the one end of the sleeve tube.

BRIEF DESCRIPTION OF THE DRAWINGS

The accompanying drawings illustrate a preferred embodiment of the present invention wherein:

FIG. 2 is an enlarged detailed view of the left portion of the rightmost cryocooler coldhead and associated sleeve assembly and superconducting coil assembly structure; and FIG. 3 is an enlarged detailed view of the right portion of the rightmost cryocooler coldhead and associated sleeve assembly and superconducting coil assembly structure.

DETAILED DESCRIPTION OF THE INVENTION

Figure 1:
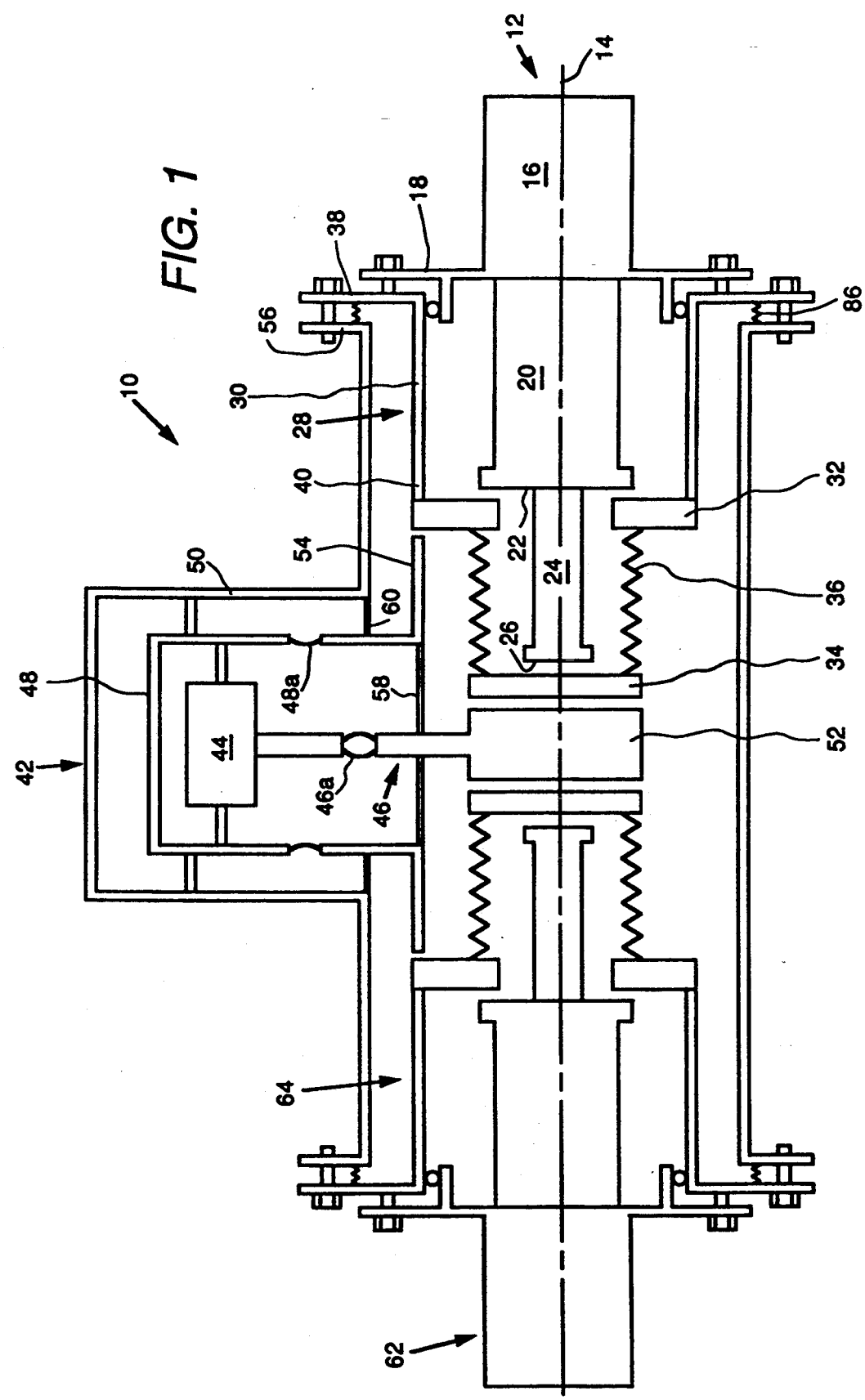
FIG. 1 is a schematic top planar view of a superconducting magnet including a superconducting coil assembly, two sleeve assemblies, and two cryocooler coldheads.

Referring now to the drawings, wherein like numerals represent like elements throughout, FIGS. 1-3 show the superconducting magnet 10 of the present invention. The magnet 10 includes a first cryocooler coldhead 12 having a generally longitudinal axis 14. The first cryocooler coldhead 12 510 includes: a room temperature housing 16 having a flange 18; a first stage 20 attached to, and longitudinally projecting from, the room temperature housing 16 and having an end 22; and a second stage 24 attached to, and longitudinally projecting from, the first stage 20 and having an end 26. The first cryocooler coldhead 12 could be a conventional Gifford-McMahon cryocooler with the first stage 20 20 maintained at a temperature of generally forty Kelvin and with the second stage 24 maintained at a temperature of generally ten Kelvin. Preferably, a compressible indium gasket 23 is attached to the end 22, and a compressible indium gasket 27 is attached to the end 26.

The magnet 10 also includes a first sleeve assembly 28 which acts as a cryocooler penetration assembly and which is generally coaxially aligned with the first cryocooler coldhead 12. The first sleeve assembly 28 includes a sleeve tube 30, a mid portion 32, an end portion 34, and a first flexible bellows 36. The sleeve tube 30 has two ends 38 and 40 and is generally radially spaced apart from, and generally circumferentially surrounds, the first stage 20. The flange 18 of the room temperature housing 16 is hermetically and longitudinally adjustably connected to one of the ends 38 of the sleeve tube 30. The mid portion 32 is hermetically connected to the other of the ends 40 of the sleeve tube 30 and is disposed longitudinally proximate and unconnected to the end 22 of the first stage 20. The end portion 34 is disposed longitudinally proximate and unconnected to the end 26 of the second stage 24. Preferably, a compressible indium gasket 35 is attached to the end portion 34. The first flexible bellows 36 is generally radially spaced apart from and generally circumferentially surrounds the second stage 24 and is hermetically connected to the end portion 34 and to the mid portion 32.

The magnet 10 further includes a superconducting coil assembly 42. The superconducting coil assembly 42 includes a magnet cartridge 44, a thermal busbar 46, a thermal shield 48, and a vacuum enclosure 50. The thermal busbar 46 is attached to the magnet cartridge 44 and has an end 52 (also called the ten Kelvin thermal station or 10K station) disposed longitudinally proximate the end portion 34 of the first sleeve assembly 28. The thermal shield 48 generally surrounds the magnet cartridge 44 and has an end 54 (also called the forty Kelvin thermal station or 40K station) disposed longitudinally proximate the mid portion 32 of the first sleeve assembly 28. Preferably, a compressible indium gasket 55 is attached to the end 54. The vacuum enclosure 50 generally surrounds the thermal shield 48 and has an end 56. The one end 38 of the sleeve tube 30 is hermetically and longitudinally adjustably connected to the end 56 of the vacuum enclosure 50.

Preferably, the thermal busbar 46 has a flexible intermediate portion 46a and the thermal shield 48 has a flexible intermediate portion 48a to isolate the superconducting coil assembly 42 from vibrations transferred by the first cryocooler coldhead 12. In this design, the end 54 of the thermal shield 48 is rigidly and thermally insulatingly connected to the end 52 of the thermal busbar 46 such as by a thin support tube 58. Likewise, the end 56 of the vacuum enclosure 50 is rigidly and thermally insulatingly connected to the end 54 of the thermal shield 48 such as by a thin support tube 60. The support tubes 58 and 60 may be made from nonmagnetic stainless steel.

In an exemplary embodiment, the magnet 10 additionally includes a second cryocooler coldhead 62 generally identical to, and generally coaxially aligned with, the first cryocooler coldhead 12 and additionally includes a second generally longitudinally extending sleeve assembly 64 generally identical to, and generally coaxially aligned with, the first sleeve assembly 28. The second cryocooler coldhead 62 is disposed generally in mirror image to the first cryocooler coldhead 12 about the thermal busbar 46, and the second sleeve assembly 64 is disposed generally in mirror image to the first sleeve assembly 28 about the thermal busbar 46. The dual cryocooler coldhead and dual sleeve assembly design enables continuous magnet operation by one of the cryocooler coldheads while the other cryocooler coldhead is being replaced.

Preferred detail designs for the magnet 10 of the invention include the first flexible bellows 36 having two rigid ends 66 and 68 and a flexible intermediate portion 70. One of the ends 66 of the first flexible bellows 36 is attached to the intermediate portion 70 of the first flexible bellows 36 and is also attached to the end portion 34 of the first sleeve assembly 28. The other of the ends 68 of the first flexible bellows 36 is attached to the intermediate portion 70 of the first flexible bellows 36 and is also attached to the mid portion 32 of the first sleeve assembly 28.

Applicants have found that magnet designs which employ a force to extend a bellows and which rely on the flexing action alone of the bellows to retract the bellows when the force is removed, will fail to retract in a cryogenic environment as members (typically having knurled surfaces) in compressing contact with an interposed compressible indium gasket (for better thermal contact) tend to stick together. For example, end portion 34 and end 52 are in contact with interposed indium gasket 35 (when the cryocooler coldhead 12 is installed) and tend to stick together. Applicants' invention employs a mechanically retractable sleeve tube 30 which exerts a pulling force to retract the first flexible bellows 36. To further ensure bellows retraction, the rigid ends 66 and 68 of the first flexible bellows 36 each include a radially outwardly extending flange 72, and a generally longitudinally extending capture tube 74 is provided which generally circumferentially surrounds the first flexible bellows 36. The capture tube 74 has two ends 76 and 78 each with a radially inwardly extending flange 80 which are longitudinally proximate and together longitudinally surround the flanges 72 of the ends 66 and 68 of the first flexible bellows 36. As can be appreciated by those skilled in the art, after the first flexible bellows 36 is extended a predetermined distance, the presence of the capture tube 74 causes the flanges 72 and 80 to engage each other such that the first flexible bellows 36 thereafter acts as a rigid member to pull the end portion 34 of the first sleeve assembly 28 out of thermal contact with the end 52 of the thermal busbar 46.

As shown in FIG. 2, the mid portion 32 of the first sleeve assembly 28 preferably includes: a first multiplicity of circumferentially spaced apart and longitudinally oriented spring members 82 (such as Belleville washers); a second multiplicity of circumferentially spaced apart and longitudinally flexible thermal connectors 84 (such as flexible thermal busbars made from laminated oxygen-free-hard copper); and an interface ring 85, as can be appreciated by those skilled in the art.

In an exemplary detailed design whereby the one end 38 of the sleeve tube 30 is hermetically and longitudinally adjustably connected to the end 56 of the vacuum enclosure 50, there is provided a second flexible bellows 86 having has two ends 88 and 90. One of the ends 88 of the second flexible bellows 86 is hermetically connected to the one end 38 of the sleeve tube 30, and the other of the ends 90 of the second flexible bellows 86 is hermetically connected to the end 56 of the vacuum enclosure 50. A first plurality of bolts 92 are also provided to engage the one end 38 of the sleeve tube 30 and the end 56 of the vacuum enclosure 50. As can be appreciated by those skilled in the art, the second flexible bellows 86 and first plurality of bolts 92 provide a first means for hermetically connecting the first sleeve assembly 28 and the vacuum enclosure 50 and for longitudinally moving the first sleeve assembly 28 into thermal contact with the thermal shield 48 and out of thermal contact with the thermal shield 48 and the thermal busbar 46.

In another exemplary detailed design whereby the flange 18 of the room temperature housing 16 is hermetically and longitudinally adjustably connected to the one end 38 of the sleeve tube 30, there is provided an O-ring gland seal 94 which is circumferentially disposed between, and in compressive contact with, the flange 18 of the room temperature housing 16 and the one end 38 of the sleeve tube 30. A second plurality of bolts 96 are also provided to engage the flange 18 of the room temperature housing 16 and the one end 38 of the sleeve tube 30. As can be appreciated by those skilled in the art, the O-ring gland seal 94 and the second plurality of bolts 96 provide a second means for hermetically and longitudinally attaching the room temperature housing 16 of the first cryocooler coldhead 12 to the first sleeve assembly 28 such that the first stage 20 and the second stage 24 are brought into unattached thermal contact with the first sleeve assembly 28 and the first sleeve assembly 28 is brought into unattached thermal contact with the thermal busbar 46 and also for longitudinally detaching the room temperature housing 16 of the first cryocooler coldhead 12 from the first sleeve assembly 28. It is seen that this second means is independent of the previously described first means.

To help with proper fitting, a conical centering ring 98 is rigidly attached to the end 52 of the thermal busbar 46 and disposed to slidingly engage the outer circumferential surface 100 of the end portion 34 of the first sleeve assembly 28.

Typically, the mid portion 32, end portion 34, and thermal busbar 46 are made of copper while the first flexible bellows 36 and the sleeve tube 30 are made from non-magnetic stainless steel. It is noted that stainless steel acts as a thermal insulator at cryogenic temperatures.

In operation, when the first cryocooler coldhead 12 is to be removed, the first plurality of bolts 92 are removed (or at least loosened), and the sleeve tube 30 is backed away about one-eighth of an inch which separates the thermal contact of the mid portion 32 of the first sleeve assembly 28 with the indium gasket 55 of the end 54 (40K station) of the thermal shield 48 and which separates the thermal contact of the indium gasket 35 of the end portion 34 of the first sleeve assembly 28 with the end 52 of the thermal busbar 46 (aided by the presence of the capture tube 74 as previously described). It is noted that with the one-eighth inch retraction of the sleeve tube 30, the magnet cartridge 44 is thermally isolated from the first sleeve assembly 28 (and the first cryocooler coldhead 12), the first cryocooler coldhead 12 remains attached to the first sleeve assembly 28, and the first sleeve assembly 28 remains hermetically connected to the vacuum enclosure 50 through the now extended second flexible bellows 86. Then, the first sleeve assembly 28 has its vacuum cavity backfilled with room temperature air (such vacuum/backfill connections not shown). Since the backfilling with air occurs after the mid portion 32 and the end portion 34 are out of thermal contact with the end 54 (40K station) of the thermal shield 48 and the end 52 (10K station) of the thermal busbar 46, no ice ball will form on the surfaces of the first sleeve assembly 28 and no heat load will be transferred to the magnet cartridge 44. Next, the second plurality of bolts 96 are removed, and the first cryocooler coldhead 12 is longitudinally removed from the first sleeve assembly 28. During such removal of the first cryocooler coldhead 12, it is noted that there is no detachment required of the first stage 20 and/or second stage 24 of the first cryocooler coldhead 12 from the first sleeve assembly 28.

In operation, when a replacement first cryocooler coldhead 12 is to be installed, the replacement first cryocooler coldhead 12 is longitudinally placed in the first sleeve assembly 28, the first sleeve assembly 28 is evacuated, and the cryocooler is started and brought to its cryogenic operating state. Then, the first plurality of bolts 92 are installed (or at least tightened) such that the sleeve tube 30 is moved until the mid portion 32 makes thermal contact with the end 54 of the thermal shield 48 by compressing the interposed indium gasket 55. Next, the second plurality of bolts 96 are installed such that end 22 of the first stage 20 makes thermal contact with the mid portion 32 by compressing the interposed indium gasket 23 and such that the end 26 of the second stage 24 makes thermal contact with the end portion 34 by compressing the interposed indium gasket 27 and the end portion 34 makes thermal contact with the end 52 of the thermal busbar 46 by compressing the interposed indium gasket 35. Thermal contacts are typically maintained at a pressure of three hundred psi, in order to compress the indium gaskets. It is noted that during coldhead installation, the first flexible bellows 36 elongates to allow the end portion 34 of the first sleeve assembly 28 to contact the end 52 of the thermal busbar 46 and that the spring members 82 accommodate any tolerances in the relative lengths of the first and second stages 20 and 24 of the first cryocooler coldhead 12. Alternatively, the first plurality of bolts 92 could be removed (or at least loosened) and the sleeve tube 30 retracted the one-eighth of an inch to put the replacement first cryocooler coldhead 12 in stand-by mode. As can be appreciated by those skilled in the art, using the dual cryocooler coldhead and dual sleeve assemblies of the invention allows the one coldhead to be replaced while the other coldhead provides continuous cooling for the magnet cartridge 44.

The foregoing description of a preferred embodiment of the invention has been presented for purposes of illustration. It is not intended to be exhaustive or to limit the invention to the precise form disclosed, and obviously many modifications and variations are possible in light of the above teaching. For example, the invention is applicable to any superconducting magnet and not just to an MRI superconducting magnet. It is intended that the scope of the invention be defined by the claims appended hereto.

We claim:

1. A superconducting magnet comprising:
   a) a first cryocooler coldhead having a generally longitudinal axis and including:
      (1) a room temperature housing having a flange;
      (2) a first stage attached to said room temperature housing and having an end; and
      (3) a second stage attached to said first stage and having an end;
   b) a first sleeve assembly generally coaxially aligned with said first cryocooler coldhead and including:
      (1) a sleeve tube having two ends and generally radially spaced apart from and generally circumferentially surrounding said first stage, wherein said flange of said room temperature housing is hermetically and longitudinally adjustably connected to one of said ends of said sleeve tube;
      (2) a mid portion hermetically connected to the other of said ends of said sleeve tube and disposed longitudinally proximate and unconnected to said end of said first stage;
      (3) an end portion disposed longitudinally proximate and unconnected to said end of said second stage; and
      (4) a first flexible bellows generally radially spaced apart from and generally circumferentially surrounding said second stage and hermetically connected to said end portion and to said mid portion; and
   c) a superconducting coil assembly including:
      (1) a magnet cartridge;
      (2) a thermal busbar attached to said magnet cartridge and having an end disposed longitudinally proximate and unconnected to said end portion of said first sleeve assembly;
      (3) a thermal shield generally surrounding said magnet cartridge and having an end disposed longitudinally proximate and unconnected to said mid portion of said first sleeve assembly; and
      (4) a vacuum enclosure generally surrounding said thermal shield and having an end, wherein said one end of said sleeve tube is hermetically and longitudinally adjustably connected to said end of said vacuum enclosure.

2. The magnet of claim 1, wherein said thermal busbar has a flexible intermediate portion, said thermal shield has a flexible intermediate portion, said end of said thermal shield is rigidly and thermally insulatingly connected to said end of said thermal busbar, and said end of said vacuum enclosure is rigidly and thermally insulatingly connected to said end of said thermal shield.

3. The magnet of claim 1, also including a second cryocooler coldhead generally identical to and generally coaxially aligned with said first cryocooler coldhead and further including a second generally longitudinally extending sleeve assembly generally identical to and generally coaxially aligned with said first sleeve assembly, said second cryocooler coldhead disposed generally in mirror image to said first cryocooler coldhead about said thermal busbar, and said second sleeve assembly disposed generally in mirror image to said first sleeve assembly about said thermal busbar.

4. The magnet of claim 1, wherein said first flexible bellows includes two rigid ends and a flexible intermediate portion, wherein one of said ends of said first flexible bellows is attached to said intermediate portion of said first flexible bellows and is also attached to said end portion of said first sleeve assembly, and wherein the other of said ends of said first flexible bellows is attached to said intermediate portion of said first flexible bellows and is also attached to said mid portion of said first sleeve assembly.

5. The magnet of claim 4, wherein said ends of said first flexible bellows each include a radially outwardly extending flange, and also including a generally longitudinally extending capture tube generally circumferentially surrounding said first flexible bellows and having two ends each with a radially inwardly extending flange longitudinally proximate and together longitudinally surrounding said flanges of said ends of said first flexible bellows.

6. The magnet of claim 5, wherein said mid portion of said first sleeve assembly also includes a first multiplicity of longitudinally oriented spring members.

7. The magnet of claim 6, wherein said mid portion of said first sleeve assembly further includes a second multiplicity of longitudinally flexible thermal connectors.

8. The magnet of claim 7, also including a second flexible bellows having two ends, wherein one of said ends of said second flexible bellows is hermetically connected to said one end of said sleeve tube and wherein the other of said ends of said second flexible bellows is hermetically connected to said end of said vacuum enclosure and further including a first plurality of bolts engaging said one end of said sleeve tube and said end of said vacuum enclosure.

9. The magnet of claim 8, also including an O-ring gland seal circumferentially disposed between and in compressive contact with said flange of said room temperature housing and said one end of said sleeve tube, and further including a second plurality of bolts engaging said flange of said room temperature housing and said one end of said sleeve tube.

10. The magnet of claim 9, wherein said end portion of said first sleeve assembly has an outer circumferential surface, and also including a conical centering ring rigidly attached to said end of said thermal busbar and disposed to slidingly engage said outer circumferential surface of said end portion of said first

* * * * *